(12) United States Patent
Kusaka

(10) Patent No.: US 11,472,097 B2
(45) Date of Patent: Oct. 18, 2022

(54) IMPRINT APPARATUS, IMPRINT METHOD, AND ARTICLE MANUFACTURING METHOD

(71) Applicant: CANON KABUSHIKI KAISHA, Tokyo (JP)

(72) Inventor: Atsushi Kusaka, Shimotsuke (JP)

(73) Assignee: Canon Kabushiki Kaisha, Tokyo (JP)

( * ) Notice: Subject to any disclaimer, the term of this patent is extended or adjusted under 35 U.S.C. 154(b) by 394 days.

(21) Appl. No.: 16/422,763

(22) Filed: May 24, 2019

(65) Prior Publication Data
US 2019/0366620 A1 Dec. 5, 2019

(30) Foreign Application Priority Data

May 31, 2018 (JP) .............................. JP2018-104912

(51) Int. Cl.
| | |
|---|---|
| *B29C 59/02* | (2006.01) |
| *H01L 21/027* | (2006.01) |
| *G03F 7/00* | (2006.01) |
| *H01L 21/56* | (2006.01) |
| *B29L 31/34* | (2006.01) |

(52) U.S. Cl.
CPC .......... *B29C 59/026* (2013.01); *G03F 7/0002* (2013.01); *H01L 21/0273* (2013.01); *B29L 2031/34* (2013.01); *H01L 21/565* (2013.01)

(58) Field of Classification Search
None
See application file for complete search history.

(56) References Cited

U.S. PATENT DOCUMENTS

| | | | | |
|---|---|---|---|---|
| 2011/0147970 A1* | 6/2011 | Sato | ...................... | G03F 7/0002 264/40.1 |
| 2016/0016353 A1* | 1/2016 | Yamamoto | ............ | G03F 7/0002 264/40.1 |
| 2016/0223919 A1* | 8/2016 | Nakagawa | ............ | G03F 9/7042 |

FOREIGN PATENT DOCUMENTS

| | | |
|---|---|---|
| JP | 2013-098291 A | 5/2013 |
| JP | 2013-125817 A | 6/2013 |
| JP | 2016-039182 A | 3/2016 |
| JP | 2017-037926 A | 2/2017 |
| KR | 2014-0127173 A | 11/2014 |
| KR | 2017-0121707 A | 11/2017 |
| WO | 2007094213 A1 | 8/2007 |

\* cited by examiner

*Primary Examiner* — Michael P. Rodriguez
(74) *Attorney, Agent, or Firm* — Canon U.S.A., Inc., IP Division

(57) ABSTRACT

An imprint apparatus includes a deforming mechanism for deforming a pattern region of a mold, and performs, after first processing for applying a first deformation amount, second processing for curing an imprint material in a state where the imprint material and the pattern region are in contact with each other and where a second deformation amount is given to the mold by the deforming mechanism to reduce an overlay error between each shot region and the pattern region. A magnitude relation between a driving force of the deforming mechanism required to set a deformation amount of the mold to the first deformation amount and a driving force of the deforming mechanism required to set the deformation amount of the mold to the second deformation amount varies depending on a magnitude of the driving force of the deforming mechanism for setting the deformation amount to the second deformation amount.

10 Claims, 11 Drawing Sheets

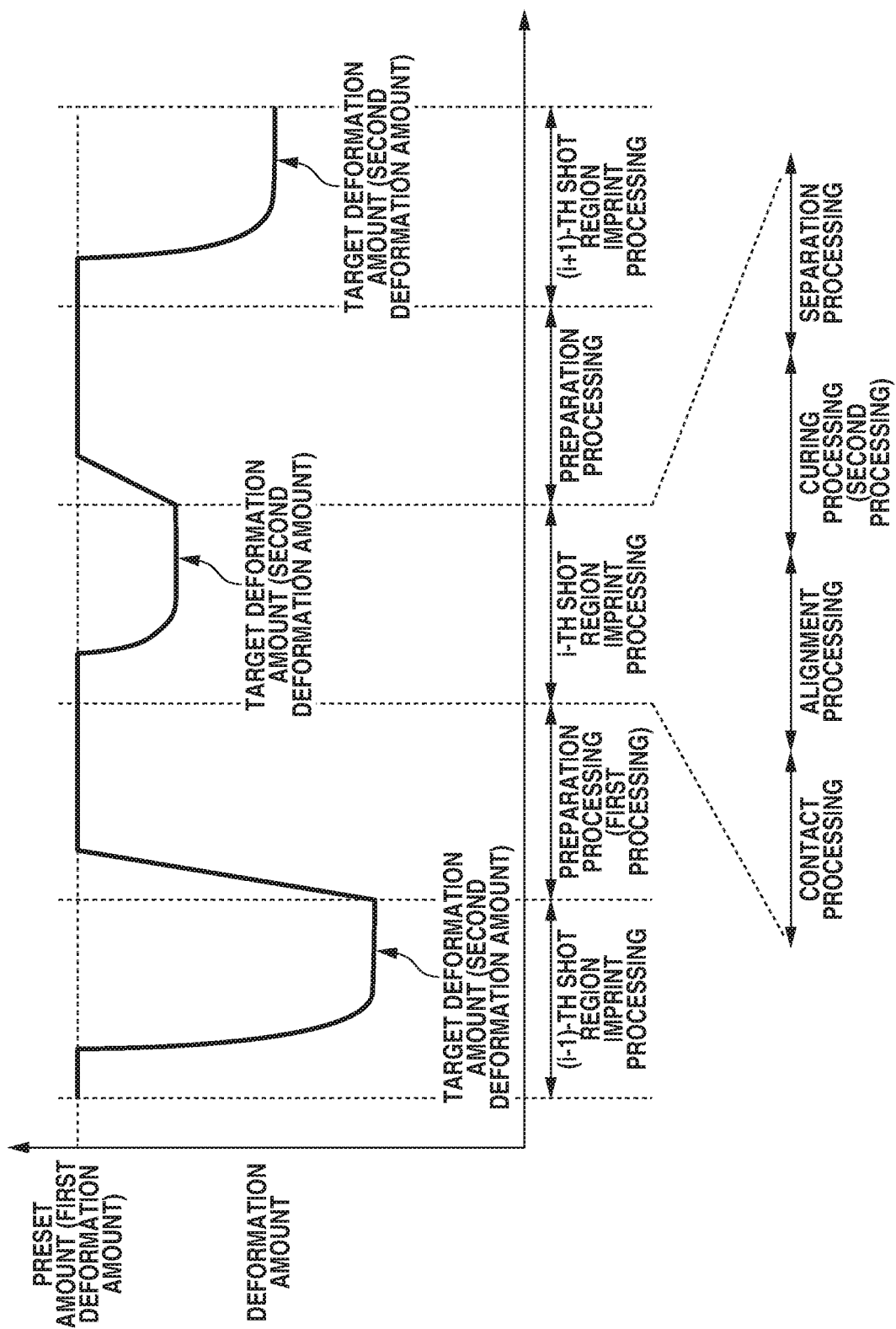

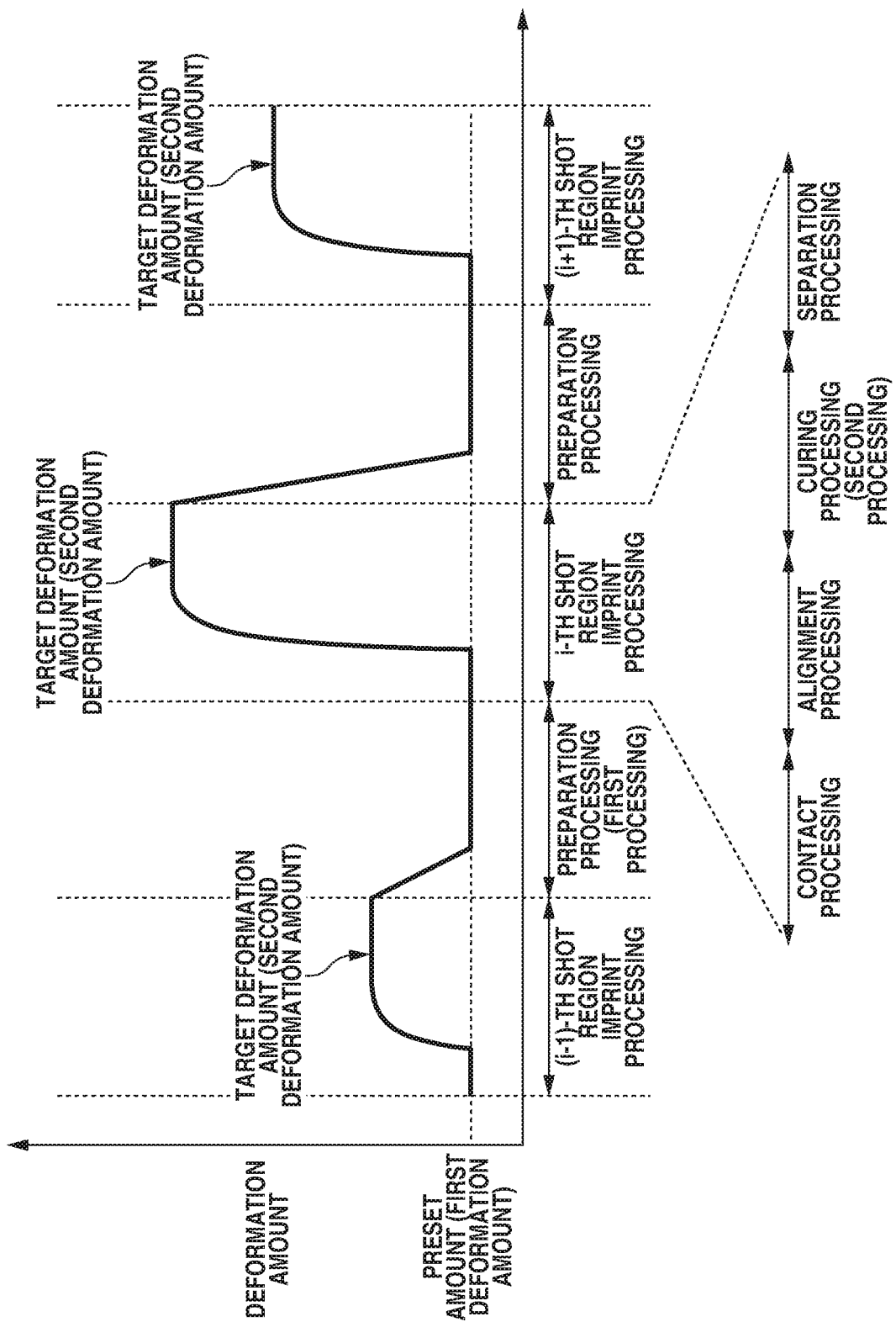

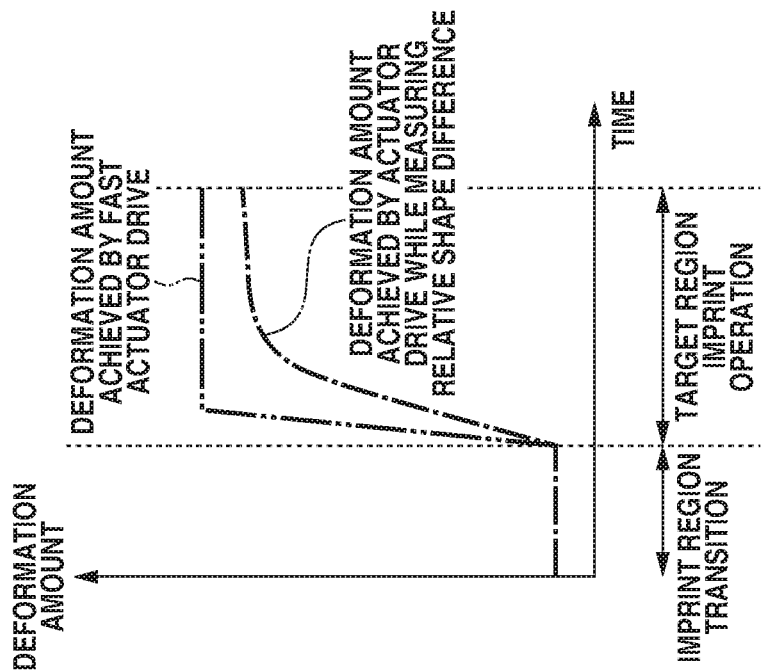
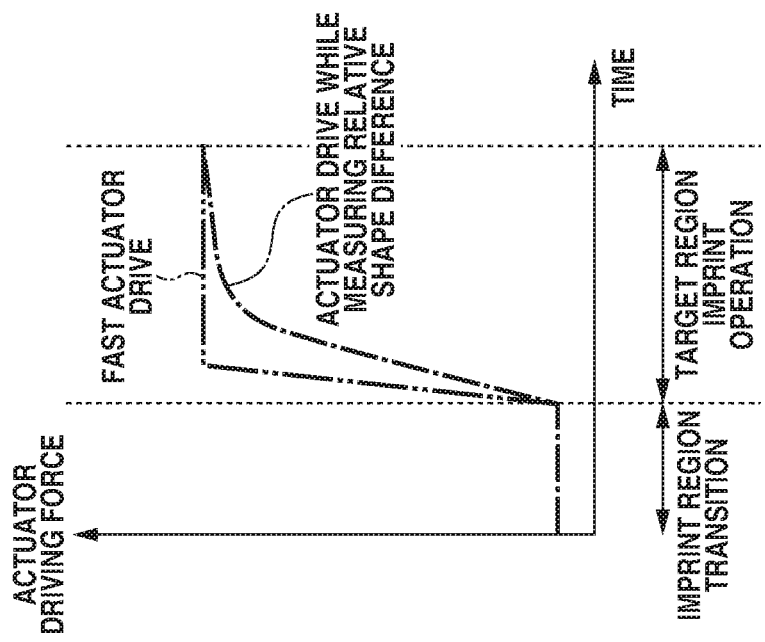

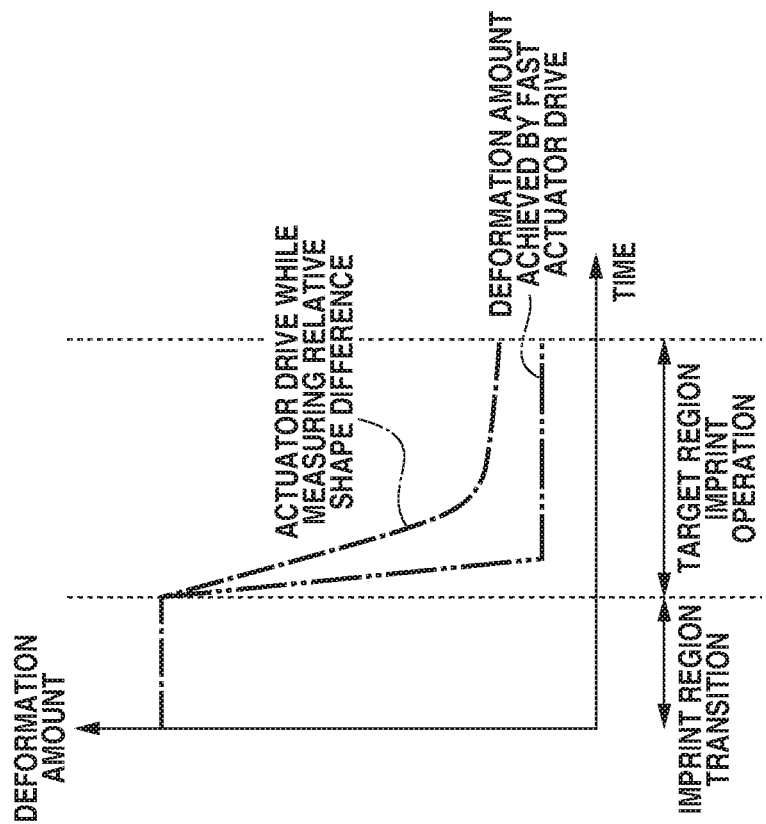
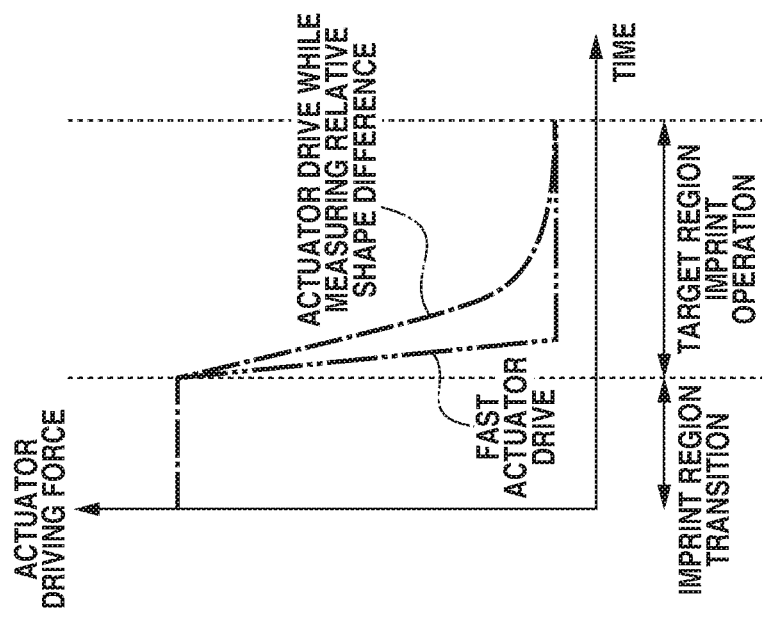

IMPRINT APPARATUS, IMPRINT METHOD, AND ARTICLE MANUFACTURING METHOD

BACKGROUND OF THE INVENTION

Field of the Invention

The present disclosure relates to an imprint apparatus, an imprint method, and an article manufacturing method.

Description of the Related Art

An imprint apparatus cures an imprint material in a state where a pattern region of a mold arranged on a shot region of a substrate is in contact with the imprint material, to form a pattern made of the cured imprint material on the shot region of the substrate. Japanese Patent Application Laid-Open No. 2013-125817 discusses an imprint apparatus which may include a deforming mechanism for deforming a pattern region of a mold by applying a force to side faces of the mold to reduce an overlay error between a shot region and the pattern region of the mold.

A plurality of shot regions is arranged on the substrate, and the plurality of the shot regions may be different in shape (including size) from each other. Therefore, the deformation amount of the pattern region of the mold by the deforming mechanism may be different for each shot region.

The present inventors have found that, when the deformation amount of the pattern region is large, the force applied to the mold and the deformation amount of the pattern region of the mold change with varying speed at which a force is applied by the deforming mechanism. With different relations between the force applied to the mold and the deformation amount of the pattern region of the mold, an overlay error may occur when sequentially performing imprint on a plurality of shot regions while changing the shape of the pattern region of the mold based on the shape of each shot region subjected to imprinting. More specifically, an overlay accuracy between the shot region and the pattern region of the mold may degrade.

SUMMARY OF THE INVENTION

According to an aspect of the present disclosure, an imprint apparatus that forms a pattern on a plurality of shot regions on a substrate by curing an imprint material in a state where a pattern region of a mold is in contact with the imprint material, includes a deforming mechanism configured to apply a force to the mold to deform the pattern region of the mold, wherein, for each shot region, after first processing for giving a first deformation amount to the mold is performed by using the deforming mechanism, second processing for curing the imprint material is performed in a state where the imprint material and the pattern region are in contact with each other and where the second deformation amount is given to the mold by the deforming mechanism to reduce an overlay error between each shot region and the pattern region, and wherein a magnitude relation between a driving force of the deforming mechanism required to set a deformation amount of the mold to the first deformation amount and a driving force of the deforming mechanism required to set the deformation amount of the mold to the second deformation amount varies depending on a magnitude of the driving force of the deforming mechanism required to set the deformation amount of the mold to the second deformation amount.

Further features of the present disclosure will become apparent from the following description of exemplary embodiments with reference to the attached drawings.

BRIEF DESCRIPTION OF THE DRAWINGS

FIG. 4 illustrates a first comparative example.

FIG. 5 illustrates a second comparative example.

FIGS. 6A and 6B illustrate an actuator driving force and a deformation amount.

FIGS. 7A and 7B illustrate an actuator driving force and a deformation amount.

DESCRIPTION OF THE EMBODIMENTS

Exemplary embodiments of the present disclosure will be described below with reference to the accompanying drawings.

Figure 1:
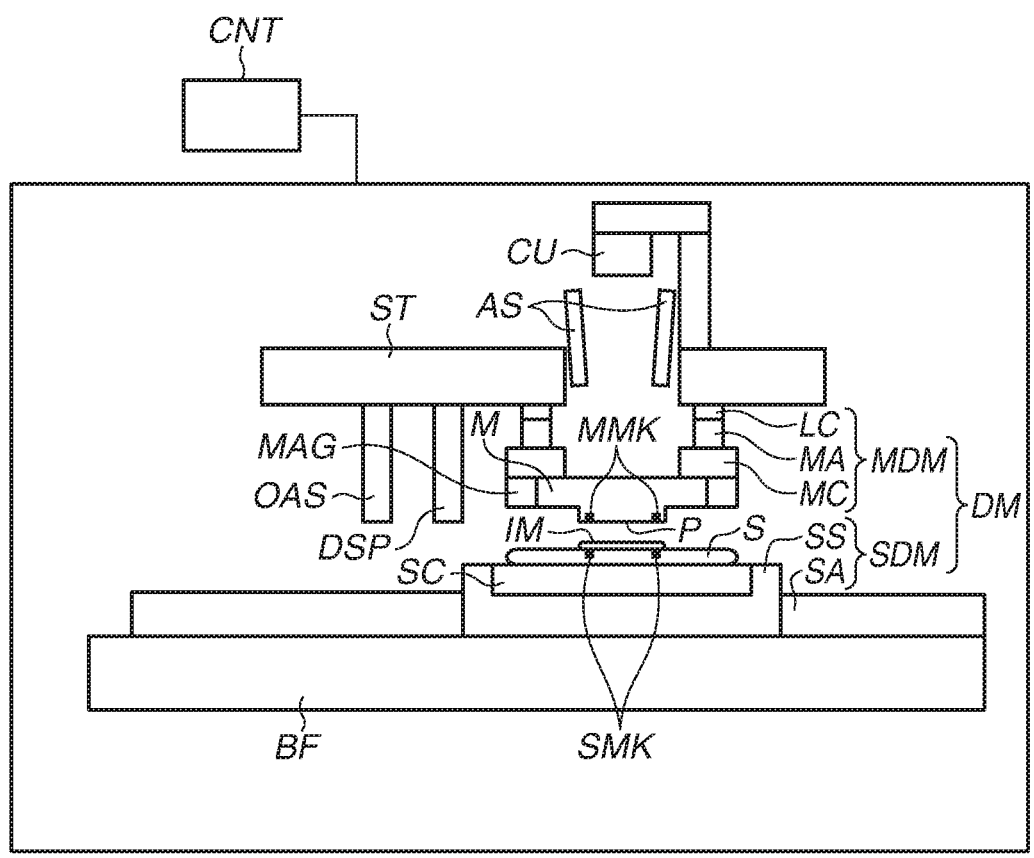
FIG. 1 illustrates a configuration of an imprint apparatus according to an exemplary embodiment of the present disclosure.

FIG. 1 illustrates a configuration of an imprint apparatus 100 according to an exemplary embodiment of the present disclosure. The imprint apparatus 100 brings an imprint material supplied on a substrate into contact with a mold and applies a curing energy to the imprint material to form a pattern of the cured material on which a concavo-convex pattern of the mold is transferred. The imprint apparatus 100 is configured in this way to form a pattern made of a cured imprint material IM on a substrate S through imprint processing. The imprint processing may include contact processing, alignment processing, curing processing, and separation processing. The contact processing refers to processing for bringing a pattern region P of a mold M into contact with the imprint material IM on each shot region on the substrate S. The alignment processing is processing for performing alignment between each shot region on the substrate S and the pattern region P of the mold M. The alignment processing in the imprint processing may include deformation processing for deforming the pattern region P of the mold M to reduce an overlay error between each shot region on the substrate S and the pattern region P of the mold M. The curing processing refers to processing for curing the imprint material IM. The separation processing refers to processing for separating a pattern made of the cured imprint material IM and the pattern region P of the mold M.

A curable composition (sometimes referred to as uncured resin) cured when a curing energy is given is used as the imprint material. The curing energy includes electromagnetic waves and heat. Electromagnetic waves may be light having a wavelength of 10 nm or more and 1 mm or less, for example, infrared rays, visible light, and ultraviolet rays.

The curable composition may be a composition cured by irradiation of light or heat. A photo-curable composition cured by irradiation of light may contain at least a polymerizable compound and a photo-polymerizable initiator and, as required, may further contain a non-polymerizable compound or a solvent. A non-polymerizable compound is at least one compound selected from groups of a sensitizer, hydrogen donor, internal mold release agent, interfacial active agent, antioxidant, and polymer component. The imprint material may be arranged on the substrate in the form of droplets, or in a form of islands or a film composed of a plurality of droplets concatenated. The viscosity (at 25° C.) of the imprint material may be, for example, 1 mPa·s or more and 100 mPa·s or less. Examples of usable materials of the substrate include glass, ceramics, metal, semiconductor, and resin. As required, the surface of the substrate may be a member made of a material different from the material of the substrate. The substrate is made of, for example, a silicon wafer, a compound semiconductor wafer, or silica glass.

According to the present specification and the accompanying drawings, directions are indicated using an XYZ coordinate system having an XY plane parallel to the surface of the substrate S. Directions parallel to the X, Y, and Z axes in the XYZ coordinate system are the X, Y, and Z directions, respectively. A rotation around the X axis, a rotation around the Y axis, and a rotation around the Z axis are represented by $\theta X$, $\theta Y$, and $\theta Z$, respectively. Control or drive with respect to the X, Y, and Z axes means control or drive with respect to a direction parallel to the X axis, a direction parallel to the Y axis, and a direction parallel to the Z axis, respectively. Control or drive with respect to the $\theta X$, $\theta Y$, and $\theta Z$ axes means control or drive with respect to a rotation around an axis parallel to the X axis, a rotation around an axis parallel to the Y axis, and a rotation around an axis parallel to the Z axis, respectively. A position is a piece of information which may be identified based on the X-, Y-, and Z-axes coordinates. An orientation is a piece of information which may be identified based on the values of the $\theta X$, $\theta Y$, and $\theta Z$ axes. Positioning means controlling the position and/or the orientation. Alignment (alignment processing) may include control of the position and/or the orientation of at least one of the substrate and the mold.

The imprint apparatus 100 may include a substrate drive mechanism SDM for holding and driving the substrate S, a base frame BF for supporting the substrate drive mechanism SDM, a mold drive mechanism MDM for holding and driving the mold M, and a structure ST for supporting the mold drive mechanism MDM. The substrate drive mechanism SDM may include a substrate stage SS including a substrate chuck SC for holding the substrate S, and a substrate positioning mechanism SA for positioning the substrate S by positioning the substrate stage SS. The mold drive mechanism MDM may include a mold chuck MC for holding the mold M, and a mold positioning mechanism MA for positioning the mold M by positioning the mold chuck MC. The mold drive mechanism MDM may also include a load cell LC for detecting the force applied to the mold M in the contact processing and/or the separation processing. The mold drive mechanism MDM may further include a pressure mechanism for applying pressure to the surface on the side opposite the pattern region P so that, in the contact processing, the pattern region P of the mold M is deformed to be convex-shaped toward the substrate S.

The substrate drive mechanism SDM and the mold drive mechanism MDM configure a drive mechanism DM for driving at least one of the substrate S and the mold M to change the relative position between the substrate S and the mold M. Changing the relative position by the drive mechanism DM includes drive for bringing the pattern region P of the mold M into contact with the imprint material on the substrate S, and drive for separating the mold M from the cured imprint material (pattern of the cured material). In other words, changing the relative position by the drive mechanism DM includes changing the relative position between the substrate S and the mold M so as to perform the contact processing and the separation processing. The substrate drive mechanism SDM may be configured to drive the substrate S with respect to a plurality of axes (e.g., 3 axes including the X, Y, and $\theta Z$ axes, preferably, 6 axes including the X, Y, Z, $\theta X$, $\theta Y$, and $\theta Z$ axes). The mold drive mechanism MDM may be configured to drive the mold M with respect to a plurality of axes (e.g., 3 axes including the Z, $\theta X$, and $\theta Y$ axes, preferably, 6 axes including the X, Y, Z, $\theta X$, $\theta Y$, and $\theta Z$ axes).

The imprint apparatus 100 may further include a deforming mechanism MAG for deforming the pattern region P of the mold M. The deforming mechanism MAG may deform the pattern region P to change the shape (including the size) of the pattern region P in a plane parallel to the XY plane. For example, the deforming mechanism MAG may deform the pattern region P by applying force to the four side faces of the mold M.

The imprint apparatus 100 may further include a dispenser DSP. However, the dispenser DSP may be configured as an external apparatus of the imprint apparatus 100. The dispenser DSP (supply unit) disposes (supplies) the imprint material IM in the shot regions on the substrate S. The dispenser DSP disposes the imprint material IM in the shot regions on the substrate S by discharging the imprint material IM in synchronization with the drive in a state where the substrate S is being driven by the substrate drive mechanism SDM. The contact processing, the alignment processing, the curing processing, and the separation processing may be performed each time the dispenser DSP disposes the imprint material IM in one shot region on the substrate S. Alternatively, the contact processing, the alignment processing, the curing processing, and the separation processing may be performed on each of the plurality of the shot regions after the dispenser DSP disposes the imprint material IM in the plurality of the shot regions on the substrate S.

The imprint apparatus 100 may further include a curing unit CU. The curing unit CU cures the imprint material IM by irradiating the imprint material IM with the curing energy in a state where the pattern region P of the mold M is in contact with the imprint material IM on the substrate S. In this way, a pattern made of the cured imprint material IM is formed on the substrate S.

The imprint apparatus 100 may further include an alignment scope (measurement device) AS for detecting (measuring) the position of a mark SMK of the shot regions on the substrate S, the position of a mark MMK of the mold M, the relative position between the mark SMK of the shot regions on the substrate S and the mark MMK of the mold M. The imprint apparatus 100 may further include an off-axis scope OAS for detecting (measuring) the position of the mark SMK of the shot regions on the substrate S.

The imprint apparatus 100 may further include a control unit CNT. The control unit CNT may control the drive mechanism DM, the deforming mechanism MAG, the dispenser DSP, the curing unit CU, the alignment scope AS, and the off-axis scope OAS. The control unit CNT may include, for example, a Programmable Logic Device (PLD) such as a Field Programmable Gate Array (FPGA), an Application Specific Integrated Circuit (ASIC), a general purpose computer with built-in programs, or a combination of all or a part of them. The control unit CNT may be disposed within the imprint apparatus 100, or installed on a location different from the location of the imprint apparatus 100 and remotely controlled.

Based on a result of the detection by the alignment scope AS, for example, based on the position of the mark SMK of a shot region on the substrate S, the control unit CNT can calculate the shape of the shot region. Based on a result of the detection by the alignment scope AS, for example, based on the position of the mark MMK of the mold M, the control unit CNT can calculate the shape of the pattern region P of the mold M. The control unit CNT may calculate an overlay error between each shot region on the substrate S and the pattern region P of the mold M based on the shape of the shot region and the shape of the pattern region P acquired in this way. Alternatively, as a result of the detection by the alignment scope AS, for example, the control unit CNT may calculate an overlay error between each shot region on the substrate S and the pattern region P of the mold M based on the relative position between the mark SMK of the substrate S and the mark MMK of the mold M. In other words, the control unit CNT may calculate an overlay error between each shot region on the substrate S and the pattern region P of the mold M (difference between the shape of the shot region and the shape of the pattern region) based on the output of the alignment scope AS. The overlay error may include, for example, magnification and distortion components (e.g., rhombus and trapezoid components or higher order components).

Figure 2:
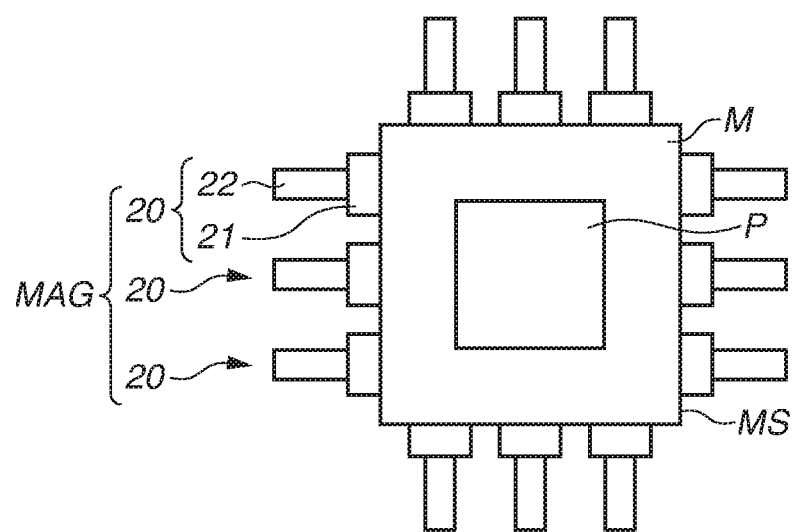
FIG. 2 illustrates an example of a configuration of a deforming mechanism.

FIG. 2 illustrates an example of a configuration of the deforming mechanism MAG. The deforming mechanism MAG may deform the pattern region P of the mold M by applying force to the four side faces MS of the mold M. The component of the shape (including the size) of the pattern region P controllable by the deforming mechanism MAG may include, for example, magnification and distortion components (e.g., rhombus and trapezoid components or higher order components). The deforming mechanism MAG may include a plurality of units 20. Each unit 20 may include a contact unit 21 in contact with a side face MS of the mold M, and an actuator 22 for driving the contact unit 21. The actuator 22 may include, for example, a piezoelectric element and other elements.

Figure 3:
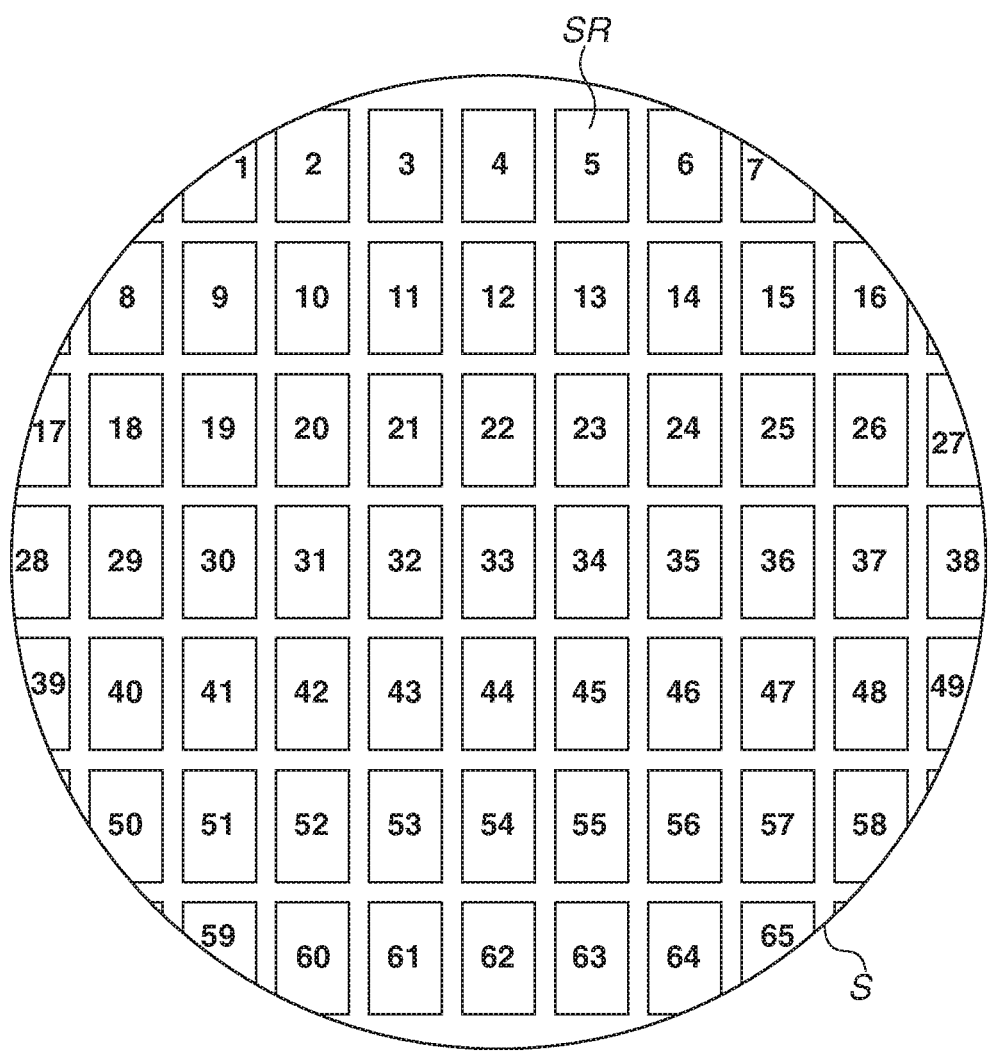
FIG. 3 illustrates an example of an arrangement of a plurality of shot regions on a substrate.

FIG. 3 illustrates an example of an arrangement of a plurality of shot regions SR on the substrate S. Reference numerals illustrated in FIG. 3 are numbers (shot numbers) given to identify the plurality of the shot regions SR. The imprint processing for the plurality of the shot regions SR may be performed in a predetermined order.

Substrate processing for performing the imprint processing on each of the plurality of the shot regions of the substrate S will be described with reference to FIGS. 4 to 10. Referring to FIGS. 4 to 10, "Deformation amount" may be the deformation amount given to the pattern region P of the mold M by the actuator 22 of one unit 20 of the deforming mechanism MAG. The shape (including the size) of the pattern region P of the mold M may be determined by the combination of the forces applied to the mold M by the actuators 22 of the plurality of the units 20 of the deforming mechanism MAG. The control unit CNT gives instruction values for controlling the shape of the pattern region P of the mold M to the actuators 22 of the plurality of the units 20 of the deforming mechanism MAG.

Referring to FIGS. 4 to 10, an (i−1)-th shot region, an i-th shot region, and an (i+1)-th shot region are shot regions of the substrate S, and the imprint processing is performed on the (i−1)-th, the i-th, and the (i+1)-th shot regions in this order. "Target deformation amount" refers to an instruction value given to the actuator 22 of the one unit 20 of the deforming mechanism MAG (or an operation amount corresponding to the instruction value) by the control unit CNT. Preparation processing (first processing) refers to processing for preparing for the next imprint processing after completion of the imprint processing on a certain shot region. The preparation processing may include, for example, processing for disposing the imprint material IM with the dispenser DSP to the shot region to be subjected to the next imprint processing, and processing for disposing the shot region to be subjected to the next imprint processing under the mold M. Processing illustrated in FIGS. 4 to 10 is controlled by the control unit CNT.

For each shot region, the imprint apparatus 100 performs second processing (curing processing) after completion of first processing (preparation processing). In the first processing, the first deformation amount is given to the mold M by each actuator 22. In the second processing, the imprint material IM is cured in a state where the imprint material IM on the shot region is in contact with the pattern region P and where the second deformation amount is given to the mold M by each actuator 22 to reduce an overlay error between the shot region and the pattern region P. The first processing is performed as part of the preparation processing, and the second processing (curing processing) is performed as part of the imprint processing.

FIG. 4 illustrates a first comparative example. In the first comparative example, before driving each actuator 22 to achieve the target deformation amount, prior drive is performed to give a large deformation amount for the target deformation amount on all of the shot regions.

In the first comparative example, an overlay error is measured by using the alignment scope AS in the alignment processing in the imprint processing for each shot region, and the target drive amount is determined by the control unit CNT based on this measurement. In the preparation processing (first processing) performed between the imprint processing and the imprint processing, the first deformation amount as a deformation amount of the pattern region P of the mold M is set to a predetermined preset amount. More specifically, in the first comparative example, the deformation amount is changed from the preset amount (first deformation amount) to the target deformation amount (second deformation amount) for the i-th shot region in the alignment processing in the imprint processing for the i-th shot region. Further, in the first comparative example, the deformation amount is changed from the preset amount (first deformation amount) to the target deformation amount (second deformation amount) for the (i+1)-th shot region in the alignment processing in the imprint processing for the (i+1)-th shot region.

In the first comparative example, the first deformation amount (preset amount) to be given to the pattern region P by the actuator 22 in the first processing is set to an amount of value larger than the second deformation amount of the maximum value to be given to the pattern region P in the second processing (curing processing) for the plurality of the shot regions. In other words, in the first comparative example, the first deformation amount is set to a predetermined preset amount which is set to an amount of value larger than the second deformation amount of the maximum value to be given to the pattern region P of the mold M in the second processing (curing processing) for the plurality of the shot regions.

In this case, in the second processing (curing processing) for the plurality of the shot regions, the second deformation amount of the maximum value given to the pattern region P of the mold M may be determined based on results of previously performed processing (e.g., processing for the preceding lot, the preceding substrate, or a lot produced by using a mold of the same type). The first deformation amount (preset amount) can be determined by adding a margin to the maximum value.

In the first comparative example, the plurality of the shot regions has the same magnitude relation between the first deformation amount given to the pattern region P in the first processing in the preparation processing and the second deformation amount given to the pattern region P in the second processing (curing processing) in the imprint processing. Accordingly, the deformation amount (first deformation amount) given to the pattern region P in the first processing in the preparation processing is constantly larger than the deformation amount (second deformation amount) given to the pattern region P in the second processing (curing processing) in the imprint processing. Thus, the pattern region P of the mold M can be deformed by a more correct deformation amount than the target deformation amount. This makes it possible to stably control the shot regions on the substrate S to be a target shape and reduce an overlay error between each shot region on the substrate S and the pattern region P of the mold M.

FIG. 5 illustrates a second comparative example. In the second comparative example, prior drive is performed to give a smaller deformation amount than the target deformation amount on all of the shot regions before driving the actuator so as to give the target deformation amount.

In the second comparative example, an overlay error is measured by using the alignment scope AS in the alignment processing in the imprint processing for each shot region, and the target deformation amount is determined by the control unit CNT based on this measurement. In the preparation processing (first processing) between the imprint processing and the imprint processing, the first deformation amount as the deformation amount of the pattern region P of the mold M is set to a predetermined preset amount. More specifically, in the second comparative example, the deformation amount is changed from the preset amount (first deformation amount) to the target deformation amount (second deformation amount) for the i-th shot region in the alignment processing in the imprint processing for the i-th shot region. In the second comparative example, the deformation amount is changed from the preset amount (first deformation amount) to the target deformation amount (second deformation amount) for the (i+1)-th shot region in the alignment processing in the imprint processing for the (i+1)-th shot region.

In the second comparative example, the first deformation amount (preset amount) to be given to the pattern region P by the actuator 22 in the first processing is set to an amount of value smaller than the second deformation amount of the minimum value to be given to the pattern region P in the second processing (curing processing) for the plurality of the shot regions. In other words, in the second comparative example, the first deformation amount is set to a predetermined preset amount which is set to an amount of value smaller than the second deformation amount of the minimum value to be given to the pattern region P of the mold M in the second processing (curing processing) for the plurality of the shot regions. In this case, in the second processing (curing processing) for the plurality of the shot regions, the second deformation amount of the minimum value given to the pattern region P of the mold M may be determined based on results of past processing (e.g., processing for the preceding lot, the preceding substrate, or a lot produced by using a mold of the same type). The first deformation amount (preset amount) can be determined by subtracting a margin from the minimum value.

Also in the second comparative example, the plurality of the shot regions has the same magnitude relation between the first deformation amount given to the pattern region P in the first processing in the preparation processing and the second deformation amount given to the pattern region P in the second processing (curing processing) in the imprint processing. As a result, the deformation amount (first deformation amount) given to the pattern region P in the first processing in the preparation processing is constantly smaller than the deformation amount (second deformation amount) given to the pattern region P in the second processing (curing processing) in the imprint processing. Thus, the pattern region P of the mold M can be deformed by a more correct deformation amount than the target deformation amount. This makes it possible to stably control the shot regions on the substrate S to be a target shape and reduce an overlay error between each shot region on the substrate S and the pattern region P of the mold M.

However, the relation between the force applied to the mold M and the shape of the pattern region P varies with the speed at which a force is applied to the mold M by the deforming mechanism MAG. Accordingly, if the relation between the force applied to the M mold and the shape of the pattern region P varies, an overlay error may occur when sequentially performing imprint on the plurality of the shot regions while changing the shape of the pattern region P of the mold M depending on the shape of the imprint target shot region.

Each of FIGS. 6A and 6B illustrates a case of rapidly driving the actuator 22 until the target actuator driving force applied to the actuator 22 for achieving the target deformation amount of the mold M is reached and a case of slowly driving the actuator 22 while measuring a relative shape difference. FIGS. 6A and 6B illustrate cases of increasing the driving force. FIG. 6A illustrates a state where the target actuator driving force is applied to the actuator 22 of the deforming mechanism MAG during the imprint operation. FIG. 6B illustrates a case where, even if the same driving force is applied to the actuator 22 until the target actuator driving force is obtained, the deformation amount of the mold M differs between a case of rapidly driving the actuator 22 and a case of slowly driving the actuator 22. In this way, the deformation amount (deformation amount change) in a case of rapidly driving the actuator 22 is larger than the deformation amount (deformation amount change) in a case of slowly driving the actuator 22. As a result, in a case of driving the actuator 22 while measuring a relative shape difference, the deformation amount may become smaller for the actuator driving force. When the deformation amount for achieving the target deformation amount increases, the target deformation amount may not possibly be obtained for the actuator driving force.

Each of FIGS. 7A and 7B illustrates a case of rapidly driving the actuator 22 until the target actuator driving force applied to the actuator 22 for achieving the target deformation amount of the mold M is obtained and a case of slowly driving the actuator 22 while measuring a relative shape difference. FIGS. 7A and 7B illustrate cases of alleviating (decreasing) the driving force. FIG. 7A illustrates a state where the target actuator driving force is applied to the actuator 22 of the deforming mechanism MAG during the imprint operation. FIG. 7B illustrates a case where, even if the same driving force is applied to the actuator 22 until the target actuator driving force is obtained, the deformation amount of the mold M differs between a case of rapidly driving the actuator 22 and a case of slowly driving the actuator 22. In this way, the deformation amount (deformation amount change) in a case of rapidly driving the actuator 22 is larger than the deformation amount (deformation amount change) in a case of slowly driving the actuator 22. Therefore, in a case of driving the actuator 22 while measuring a relative shape difference, the deformation amount may become small for the actuator driving force. When the deformation amount for achieving the target deformation amount increases, the target deformation amount may not possibly be obtained for the actuator driving force.

Figure 8:
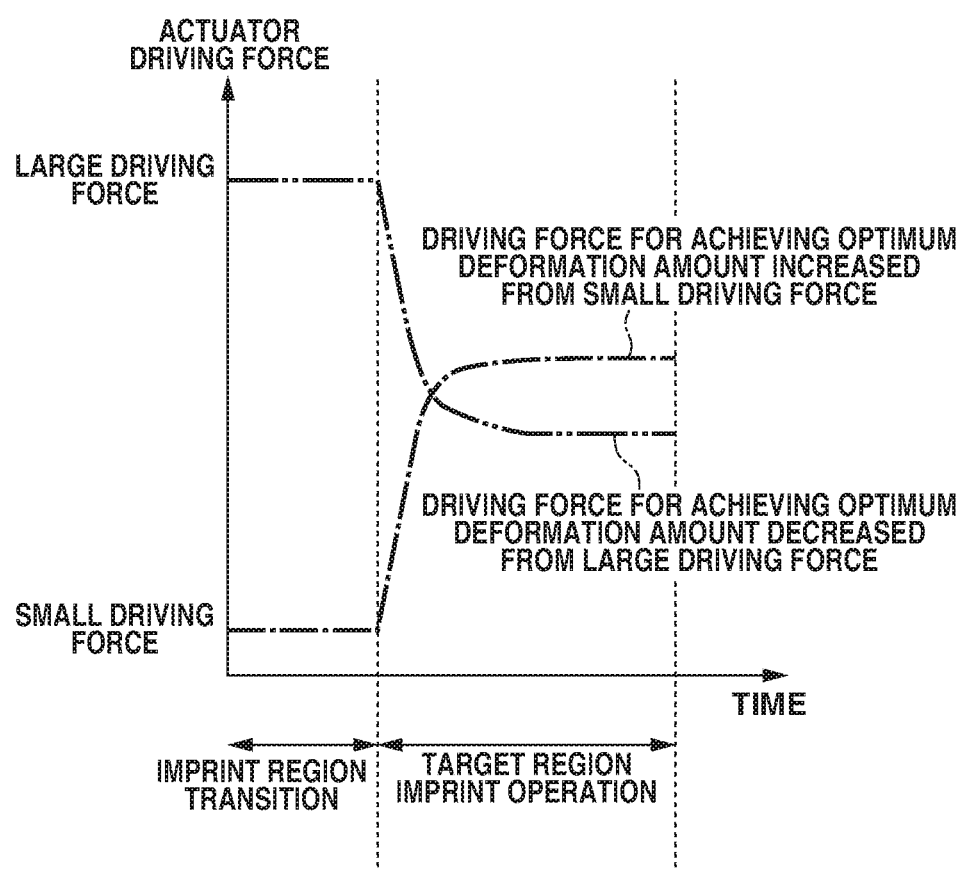
FIG. 8 illustrates a change in an actuator driving force with respect to a deformation amount.

FIG. 8 illustrates a state where the actuator driving force required to achieve the target deformation amount of the mold M differs between a case of increasing the driving force from that of a small value and a case of decreasing the driving force from that of a large value. FIG. 8 illustrates a state where the driving force of the actuator 22 reached as a result of an increase from that of a small value is larger than the driving force of the actuator 22 reached as a result of a decrease from that of a large value. The phenomena illustrated in FIGS. 6A, 6B, 7A, 7B, and 8 are caused by the influence of friction arising between the mold M and the mold chuck MC.

Figure 9:
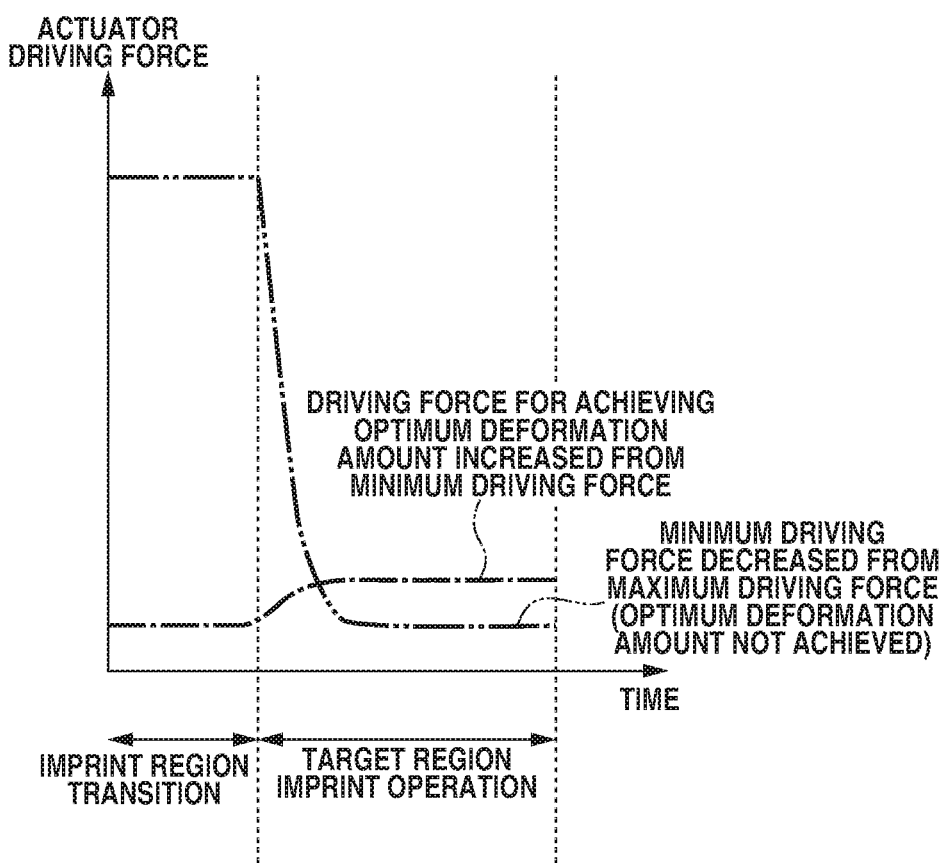
FIG. 9 illustrates a change in an actuator driving force with respect to a deformation amount according to an exemplary embodiment.

An exemplary embodiment of the present disclosure will be described below in consideration of these phenomena. FIG. 9 illustrates the exemplary embodiment of the present disclosure. According to the present exemplary embodiment, the target deformation amount for each of the plurality of the shot regions is acquired based on the shape information for the plurality of the shot regions acquired in advance before the implementation of the imprint processing. The shape information may be determined, for example, by the alignment scope AS detecting the position of the mark SMK in each shot region of the substrate S. Further, results of pre-measurement performed by using an external measurement device before the implementation of the imprint processing may be used for the shape information. Further, results of measuring the results of the imprint processing by using an external measurement device can be used as the shape information. According to the present exemplary embodiment, the first deformation amount to be given to the pattern region P of the mold M by the actuator 22 in the first processing is set to an amount of value smaller than the second deformation amount to be given to the pattern region P of the mold M in the second processing (curing processing) for the plurality of the shot regions. In other words, according to the present exemplary embodiment, the first deformation amount is set to a predetermined preset amount which is set to an amount of value smaller than the second deformation amount to be given to the pattern region P of the mold M in the second processing (curing processing) for the plurality of the shot regions. For example, the first deformation amount can be set to the lower limit of the driving force of the actuator 22.

FIG. 9 illustrates a case where the deformation amount required to achieve the target deformation amount of the mold M is close to the lower limit (minimum value) of a correction range. As illustrated in FIG. 9, there are two different cases of achieving the target deformation amount of the mold M. In one case, the actuator driving force is increased from that of a small value as described above. In the other case, the actuator driving force is decreased from that of a large value. As illustrated in FIG. 9, in a case where the deformation amount is small and close to the lower limit of the range of the deformation amount which can be taken by the mold M, a driving force required to achieve the target deformation amount can be given when increasing the actuator driving force from that of a small value. On the other hand, a driving force required to achieve the target deformation amount may not possibly be given when decreasing the actuator driving force from that of a large value. This is because the driving force of the actuator 22 will reach the minimum driving force, making it impossible to achieve the target deformation amount of the mold M. By selecting an optimal method out of the method for changing the driving force of the actuator 22 from that a large value and the method for changing the driving force thereof from that a small value, depending the magnitude of the target deformation amount of the mold M, the mold M can be deformed to the target deformation amount with a reduced limitation of the correction amount.

Figure 10:
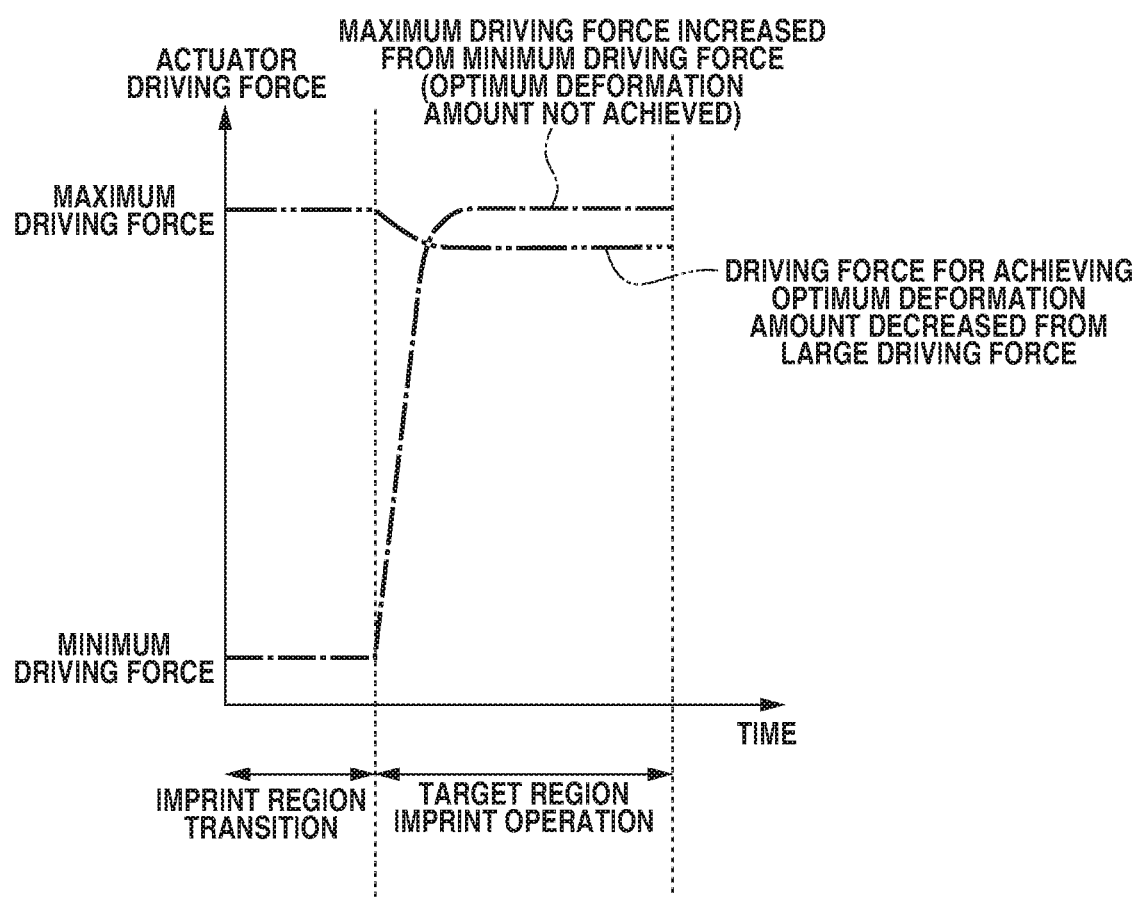
FIG. 10 illustrates a change in an actuator driving force with respect to a deformation amount according to an exemplary embodiment.

FIG. 10 illustrates another exemplary embodiment of the present disclosure. According to the present exemplary embodiment, the target deformation amount for each of the plurality of the shot regions is acquired based on the shape information for the plurality of the shot regions acquired in advance before the implementation of the imprint processing. The shape information may be determined, for example, by the alignment scope AS detecting the position of the mark SMK in each shot region of the substrate S. For example, results of pre-measurement performed by using an external measurement device before the implementation of the imprint processing may be used for the shape information. Further, results of measuring the results of the imprint processing by using an external measurement device can be used as the shape information. According to the present exemplary embodiment, the first deformation amount to be given to the pattern region P of the mold M by the actuator 22 in the first processing is set to an amount of value larger than the second deformation amount to be given to the pattern region P of the mold M in the second processing (curing processing) for the plurality of the shot regions. In other words, according to the present exemplary embodiment, the first deformation amount is set to a predetermined preset amount which is set to an amount of value larger than the second deformation amount to be given to the pattern region P of the mold M in the second processing (curing processing) for the plurality of the shot regions. For example, the first deformation amount can be set to the upper limit (maximum value) of the driving force of the actuator 22. The actuator driving force refers to a driving force generated by the rated current value regularly used. The upper limit of the driving force refers to the maximum value of the driving force generated by the current value.

Similarly, FIG. 10 illustrates a case where the deformation amount required to achieve the target deformation amount of the mold M is close to the upper limit of the correction range. As illustrated in FIG. 10, there are two different cases of achieving the target deformation amount of the mold M. In one case, the actuator driving force is increased from that of a small value as described above. In the other case, the actuator driving force is decreased from that of a large value. As illustrated in FIG. 10, in a case where the deformation amount is large and close to the upper limit of the range of the deformation amount which can be taken by the mold M, a driving force required to achieve the target deformation amount can be given when decreasing the actuator driving force from that of a large value. On the other hand, a driving force required to achieve the target deformation amount may not possibly be given when increasing the actuator driving force from that of a small value. This is because the driving force of the actuator 22 will reach the maximum driving force, making it impossible to achieve the target deformation amount of the mold M. By selecting an optimal method out of the method for changing the driving force of the actuator 22 from that of a large value and the method for changing the driving force thereof from that of a small value, according to the magnitude of the target deformation amount of the mold M, the mold M can be deformed to the target deformation amount with a reduced limitation of the correction amount.

When the actuator driving force for obtaining the deformation amount required to achieve the target deformation amount is close to the upper limit or the lower limit of the actuator driving force, optimally selecting the prior drive amount of the actuator 22 enables extending the correction range to the maximum range without being subjected to the limitation of the correction range. When the second deformation amount differs for each shot region, the magnitude of the first deformation amount can be set for each shot region based on the second deformation amount and the range of the correction amount of the mold by the actuator.

While the imprint apparatus has been described above centering on an imprint method for curing the imprint material by using the photo-curing method, the present exemplary embodiment is not limited to the photo-curing method. A method for curing the imprint material by using heat can be used. In the photo-curing method, ultraviolet curing resin is used. The substrate is irradiated with ultraviolet rays in a state where the mold is pressed onto the substrate via the resin. After the resin is cured, the mold is separated from the cured resin, to form a pattern. In a heat-based method, on the other hand, thermoplastic resin is used. The mold is pressed onto the substrate via the resin in a state where the resin is heated to the glass transition temperature or higher to improve the mobility of the resin. After the resin is cooled down, the mold is separated from the resin, to form a pattern.

The pattern of the cured material formed by using the imprint apparatus is permanently used for at least a part of various articles, or is temporarily used when manufacturing various articles. Articles include electric circuit elements, optical elements, Micro Electro Mechanical Systems (MEMS), recording elements, sensors, and molds. Electric circuit elements include volatile and nonvolatile semiconductor memories such as a dynamic random access memory (DRAM), a static random access memory (SRAM), a flash memory, and magnetoresistive random access memory (MRAM), and semiconductor elements such as large scale integrated circuits (LSI), charge coupled devices (CCD), image sensors, and field-programmable gate arrays (FPGA). Examples of molds include molds for imprint.

The pattern of the cured material is used as it is as at least a part of constituting members of the above-described articles, or is temporarily used as a resist mask. After completing etching or ion implantation in processing steps of the substrate, the resist mask is removed.

Figure 11A:
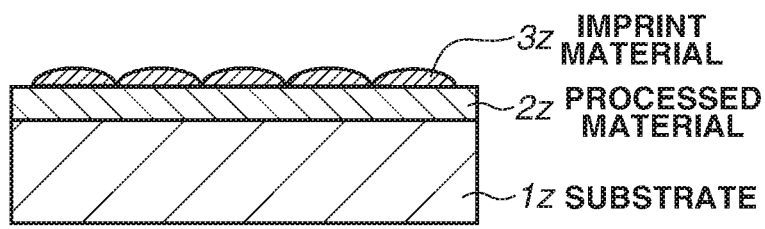
FIGS. 11A, 11B, 11C, 11D, 11E, and 11F illustrate an article manufacturing method according to an exemplary embodiment.

There is described an article manufacturing method for forming a pattern on a substrate by using an imprint apparatus, processing the substrate with the pattern formed thereon, and manufacturing an article from the substrate processed in this way. As illustrated in FIG. 11A, a substrate 1z such as a silicon wafer is prepared, with a processed material 2z such as an insulator formed on the surface of the substrate 1z. Then, an imprint material 3z is applied onto the surface of the processed material 2z through an ink-jet method. FIG. 11A illustrates a state where the imprint material 3z having a shape of a plurality of droplets is applied onto the substrate.

Figure 11B:
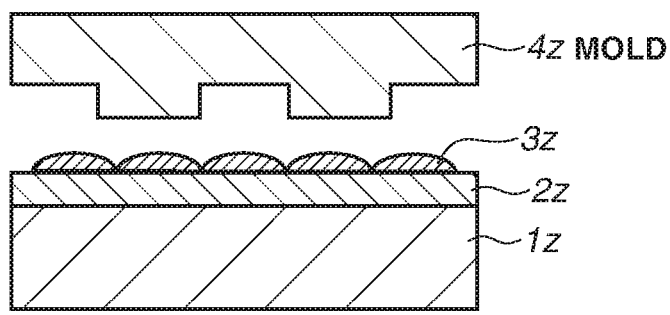
Figure 11C:
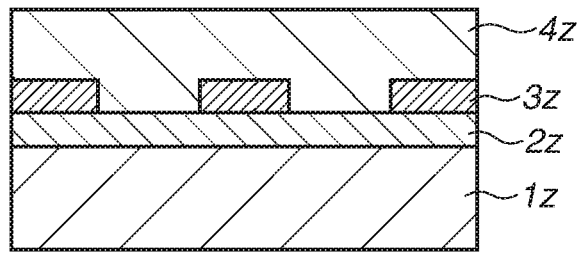

As illustrated in FIG. 11B, a mold 4z for imprint is disposed to face the imprint material 3z on the substrate. The surface of the mold 4z with a concavo-convex pattern formed thereon is oriented toward the imprint material 3z. As illustrated in FIG. 11C, the substrate 1 with the imprint material 3z applied thereto and the mold 4z are brought into contact with each other and then pressurized. The gaps between the mold 4z and the processed material 2z are filled with the imprint material 3z. In this state, when the imprint material 3z is irradiated with light as a curing energy through the mold 4z, the imprint material 3z is cured.

Figure 11D:
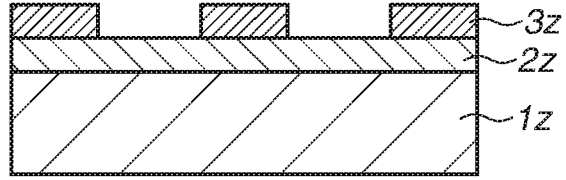

As illustrated in FIG. 11D, after the imprint material 3z is cured, when the mold 4z and the substrate 1z are separated from each other, a pattern of the cured imprint material 3z is formed on the substrate 1z. The pattern of this cured material is shaped so that concave portions of the mold 4z fit convex portions of the cured imprint material 3z, and convex portions of the mold 4z fit concave portions of the cured imprint material 3z. This means that the concavo-convex pattern of the mold 4z has been transferred onto the imprint material 3z.

Figure 11E:
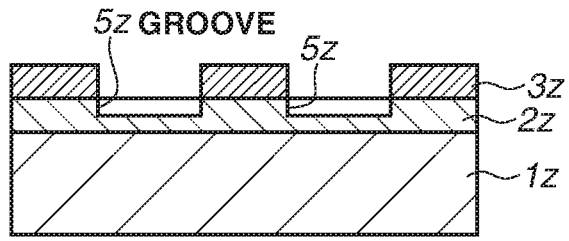
Figure 11F:
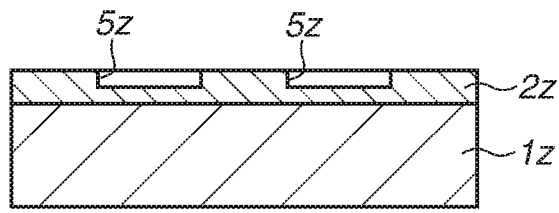

As illustrated in FIG. 11E, when etching is performed by using the pattern of the cured imprint material 3z as an etching-proof mask, surface portions of the processed material 2z where the cured imprint material 3z is absent or thinly remains are removed to form grooves 5z. As illustrated in FIG. 11F, when the pattern of the cured imprint material 3z is removed, an article can be obtained, with the grooves 5z formed on the surface of the processed material 2z. While the pattern of the cured imprint material 3z is removed in this example, the cured imprint material 3z may not be removed after the processing. For example, the cured imprint material 3z may be used as a film for insulation between layers included in a semiconductor device, i.e., as a constituting member of the article.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-104912, filed May 31, 2018, which is hereby incorporated by reference herein in its entirety.

What is claimed is:

1. An imprint apparatus that forms a pattern on a plurality of shot regions on a substrate by curing an imprint material in a state where a pattern region of a mold is in contact with the imprint material, the imprint apparatus comprising:
   a deforming mechanism configured to apply a force to the mold to deform the pattern region of the mold; and
   a control unit including one or more of a programmable logic device, an application specific integrated circuit, and a general purpose computer, wherein when executing instructions, the control unit causes the imprint apparatus to:
   for each shot region, after performing first processing for giving a first deformation amount to the mold by using the deforming mechanism, perform second processing for curing the imprint material in a state where the imprint material and the pattern region are in contact with each other, and during the second processing, give a second deformation amount to the mold by the deforming mechanism to reduce an overlay error between each shot region and the pattern region, and vary a magnitude relation between a driving force of the deforming mechanism required to set a deformation amount of the mold to the first deformation amount and a driving force of the deforming mechanism required to set the deformation amount of the mold to the second deformation amount depending on a magnitude of the driving force of the deforming mechanism required to set the deformation amount of the mold to the second deformation amount.

2. The imprint apparatus according to claim 1, wherein, in comparison with the second deformation amount, the first deformation amount is a deformation amount close to either a deformation amount of an upper limit value or a lower limit value by which the mold is deformed by the deforming mechanism.

3. The imprint apparatus according to claim 1, wherein the first deformation amount is a deformation amount given when the driving force of the deforming mechanism is set to a driving force of a maximum value.

4. The imprint apparatus according to claim 3, wherein the driving force of the deforming mechanism required to set the deformation amount of the mold to the first deformation amount is larger than the driving force of the deforming mechanism required to set the deformation amount of the mold to the second deformation amount.

5. The imprint apparatus according to claim 1, wherein the first deformation amount is a deformation amount given when the driving force of the deforming mechanism is set to a driving force of a minimum value.

6. The imprint apparatus according to claim 5, wherein the driving force of the deforming mechanism required to set the deformation amount of the mold to the first deformation amount is smaller than the driving force of the deforming mechanism required to set the deformation amount of the mold to the second deformation amount.

7. The imprint apparatus according to claim 1, further comprising a measurement device configured to measure an overlay error between each of the plurality of the shot regions and the pattern region, wherein, when executing the instructions, the control unit further causes the second deformation amount to be determined based on a result of measurement by the measurement device.

8. The imprint apparatus according to claim 1, wherein, when executing the instructions, the control unit further causes the first deformation amount to be determined based on pre-acquired shape information for the plurality of the shot regions.

9. The imprint apparatus according to claim 1, wherein, when executing the instructions, in the second processing, the control unit further causes the driving force of the deforming mechanism required to set the deformation amount of the mold to the second deformation amount to be given to the mold to reduce an overlay error between each shot region and the pattern region in a state where the imprint material and the pattern region are in contact with each other.

10. An imprint apparatus that forms a pattern on a plurality of shot regions on a substrate by curing an imprint material in a state where a pattern region of a mold is in contact with the imprint material, the imprint apparatus comprising:
a deforming mechanism configured to apply a force to the mold to deform the pattern region of the mold; and
a control unit including one or more of a programmable logic device, an application specific integrated circuit, and a general purpose computer, wherein when executing instructions, the control unit causes the imprint apparatus to:
for each shot region, after performing first processing for applying a first force to the mold by using the deforming mechanism, perform second processing for curing the imprint material in a state where the imprint material and the pattern region are in contact with each other, and during the second processing, apply a second force to the mold by the deforming mechanism to reduce an overlay error between each shot region and the pattern region, and
vary a magnitude relation between the first and the second forces depending on a magnitude of the second force.

* * * * *